(12) United States Patent
Scanlan

(10) Patent No.: US 9,502,397 B1
(45) Date of Patent: Nov. 22, 2016

(54) 3D INTERCONNECT COMPONENT FOR FULLY MOLDED PACKAGES

(71) Applicant: DECA Technologies Inc., Tempe, AZ (US)

(72) Inventor: Christopher M. Scanlan, Chandler, AZ (US)

(73) Assignee: Deca Technologies, Inc., Tempe, AZ (US)

(*) Notice: Subject to any disclaimer, the term of this patent is extended or adjusted under 35 U.S.C. 154(b) by 0 days.

(21) Appl. No.: 15/141,028

(22) Filed: Apr. 28, 2016

Related U.S. Application Data

(60) Provisional application No. 62/154,218, filed on Apr. 29, 2015.

(51) Int. Cl.
| | |
|---|---|
| *H01L 21/56* | (2006.01) |
| *H01L 25/00* | (2006.01) |
| *H01L 21/52* | (2006.01) |
| *H01L 21/78* | (2006.01) |
| *H01L 21/48* | (2006.01) |

(52) U.S. Cl.
CPC ........... *H01L 25/50* (2013.01); *H01L 21/4846* (2013.01); *H01L 21/4853* (2013.01); *H01L 21/52* (2013.01); *H01L 21/565* (2013.01); *H01L 21/568* (2013.01); *H01L 21/78* (2013.01); *H01L 2225/06517* (2013.01); *H01L 2225/06527* (2013.01); *H01L 2225/06541* (2013.01)

(58) Field of Classification Search
CPC ................. H01L 25/50; H01L 21/4846; H01L 21/4853; H01L 21/52; H01L 21/565; H01L 21/568; H01L 21/78; H01L 2225/06517; H01L 2225/06527; H01L 2225/06541
See application file for complete search history.

(56) References Cited

U.S. PATENT DOCUMENTS

| | | | |
|---|---|---|---|
| 6,546,620 B1 * | 4/2003 | Juskey | H01L 24/81 228/180.21 |
| 8,487,435 B2 * | 7/2013 | Juskey | H01L 21/561 257/690 |
| 9,040,316 B1 * | 5/2015 | Scanlan | H01L 21/76879 438/15 |
| 9,082,806 B2 * | 7/2015 | Lin | H01L 21/6835 |
| 9,269,622 B2 * | 2/2016 | Scanlan | H01L 21/78 |

(Continued)

*Primary Examiner* — Earl Taylor
(74) *Attorney, Agent, or Firm* — Booth Udall Fuller, PLC

(57) ABSTRACT

A method of making a semiconductor component package can include providing a substrate comprising conductive traces, soldering a surface mount device (SMD) to the substrate with solder, encapsulating the SMD on the substrate with a first mold compound over and around the SMD to form a component assembly, and mounting the component assembly to a temporary carrier with a first side of the component assembly oriented towards the temporary carrier. The method can further include mounting a semiconductor die comprising a conductive interconnect to the temporary carrier adjacent the component assembly, encapsulating the component assembly and the semiconductor die with a second mold compound to form a reconstituted panel, and exposing the conductive interconnect and the conductive traces at the first side and the second side of the component assembly with respect to the second mold compound.

20 Claims, 7 Drawing Sheets

(56) References Cited

U.S. PATENT DOCUMENTS

| | | | |
|---|---|---|---|
| 9,287,204 B2* | 3/2016 | Kim | H01L 21/561 |
| 2007/0278701 A1* | 12/2007 | Chang | H01L 21/481 |
| | | | 257/787 |
| 2011/0156239 A1* | 6/2011 | Jin | H01L 21/78 |
| | | | 257/692 |
| 2011/0285007 A1* | 11/2011 | Chi | H01L 21/4846 |
| | | | 257/686 |
| 2013/0075924 A1* | 3/2013 | Lin | H01L 24/19 |
| | | | 257/774 |
| 2013/0280826 A1* | 10/2013 | Scanlan | H01L 23/544 |
| | | | 438/15 |
| 2013/0341784 A1* | 12/2013 | Lin | H01L 24/19 |
| | | | 257/737 |
| 2014/0048906 A1* | 2/2014 | Shim | H01L 23/481 |
| | | | 257/531 |
| 2014/0091454 A1* | 4/2014 | Lin | H01L 24/19 |
| | | | 257/734 |
| 2014/0110858 A1* | 4/2014 | Beer | H01L 24/19 |
| | | | 257/774 |
| 2014/0159251 A1* | 6/2014 | Marimuthu | H01L 24/19 |
| | | | 257/774 |
| 2014/0335658 A1* | 11/2014 | Scanlan | H01L 21/78 |
| | | | 438/113 |
| 2015/0115456 A1* | 4/2015 | Scanlan | H01L 21/56 |
| | | | 257/773 |
| 2015/0187710 A1* | 7/2015 | Scanlan | H01L 24/02 |
| | | | 257/777 |
| 2015/0279824 A1* | 10/2015 | Nair | H01L 25/16 |
| | | | 257/741 |
| 2015/0371960 A1* | 12/2015 | Yap | H01L 23/66 |
| | | | 257/659 |
| 2015/0380386 A1* | 12/2015 | Vincent | H01L 25/50 |
| | | | 257/773 |
| 2016/0005628 A1* | 1/2016 | Yap | H01L 21/561 |
| | | | 257/774 |
| 2016/0064334 A1* | 3/2016 | Bishop | H01L 23/544 |
| | | | 438/15 |
| 2016/0073496 A1* | 3/2016 | Vincent | H05K 1/0298 |
| | | | 361/772 |
| 2016/0086930 A1* | 3/2016 | Koey | H01L 23/5389 |
| | | | 257/773 |
| 2016/0093580 A1* | 3/2016 | Scanlan | H01L 23/48 |
| | | | 257/737 |
| 2016/0099212 A1* | 4/2016 | Vincent | H01L 23/5389 |
| | | | 257/774 |
| 2016/0118333 A1* | 4/2016 | Lin | H01L 25/50 |
| | | | 257/773 |

* cited by examiner

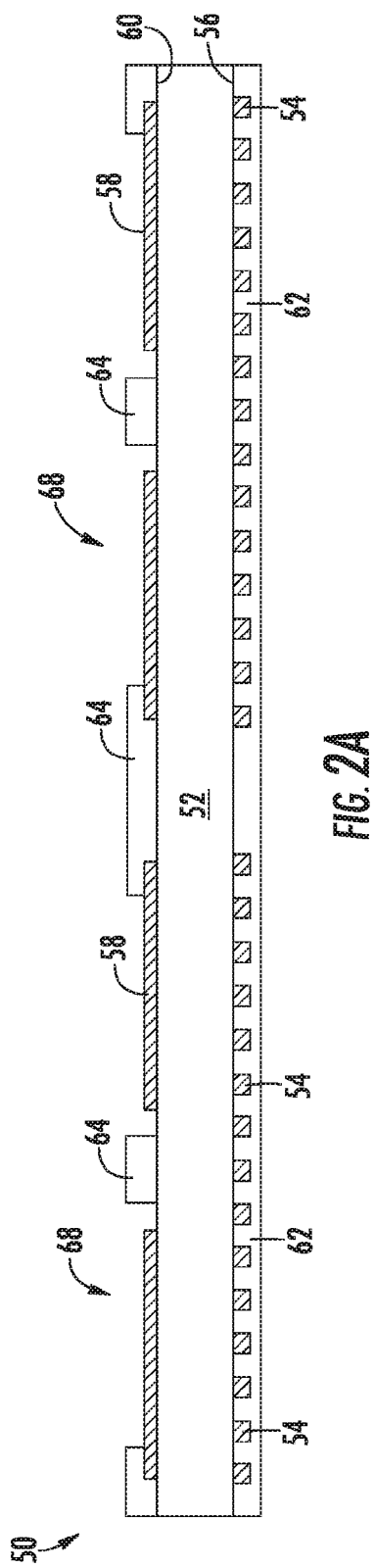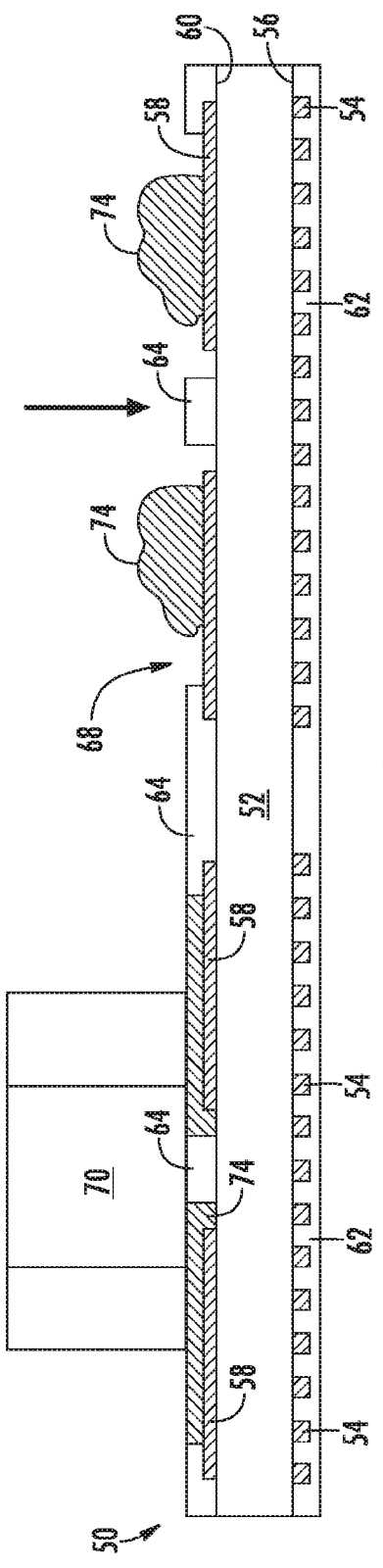

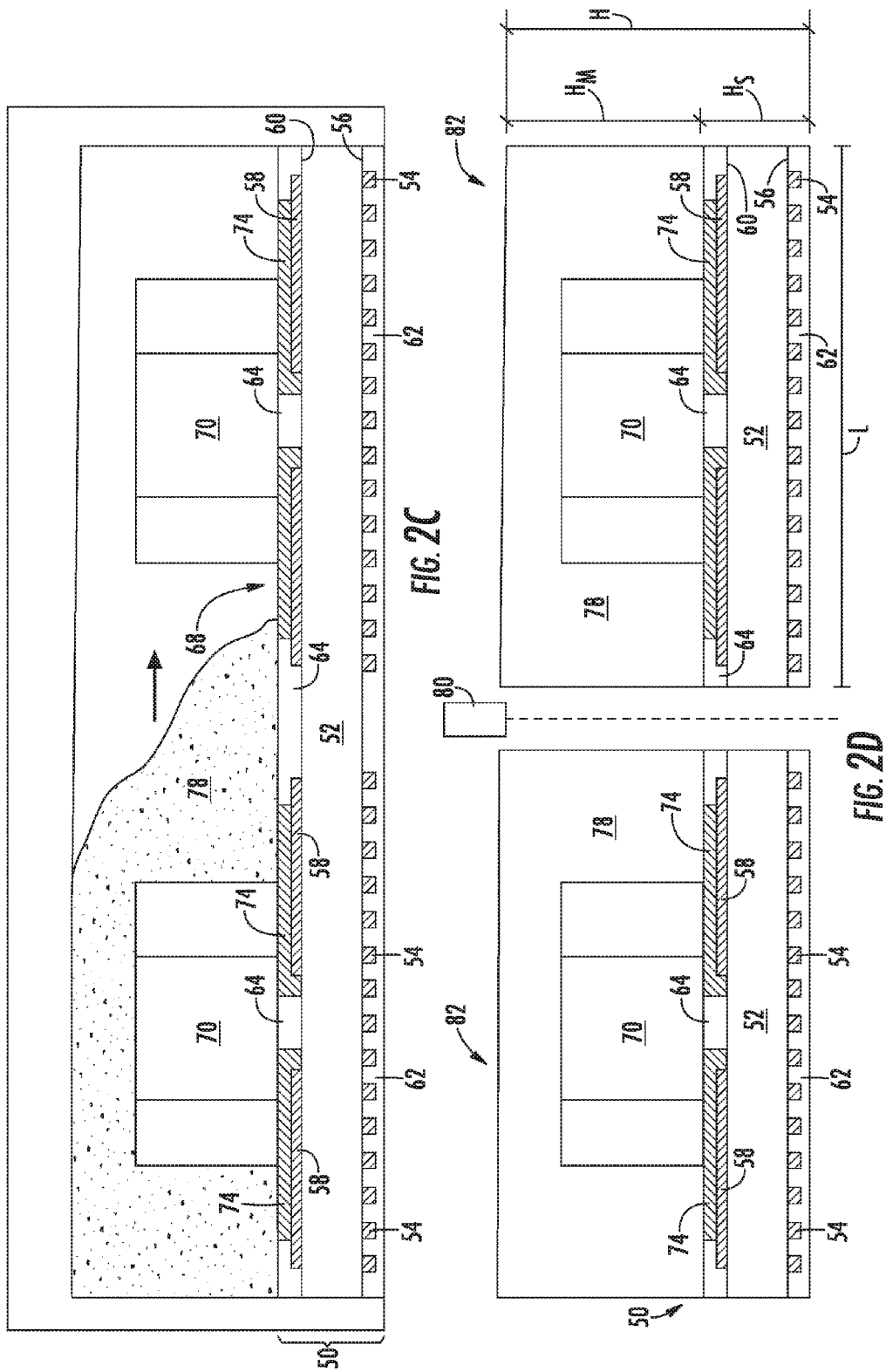

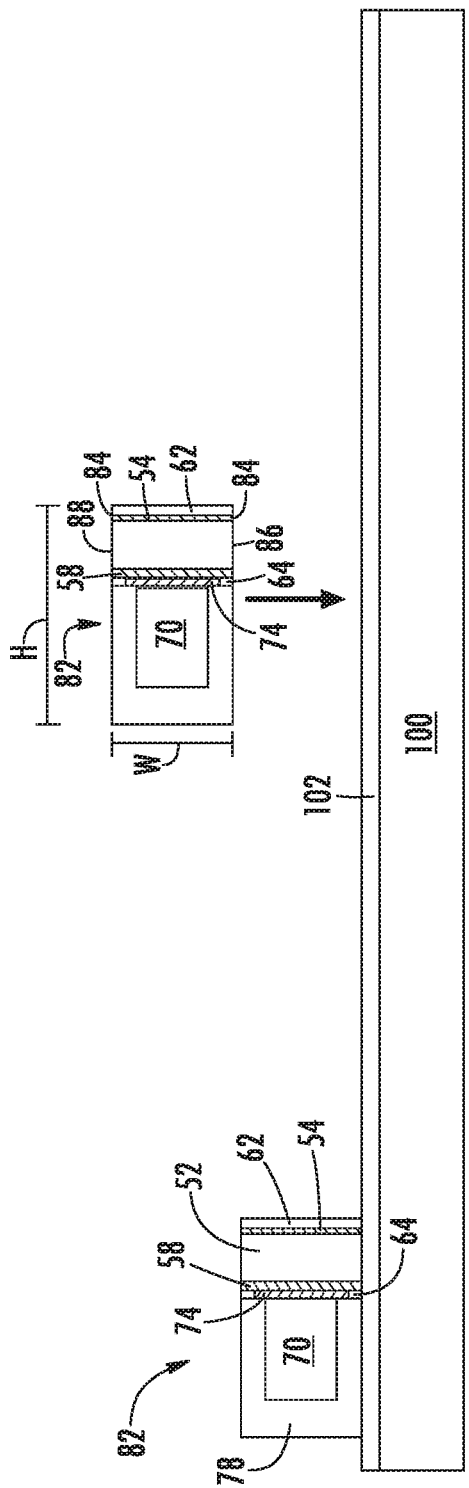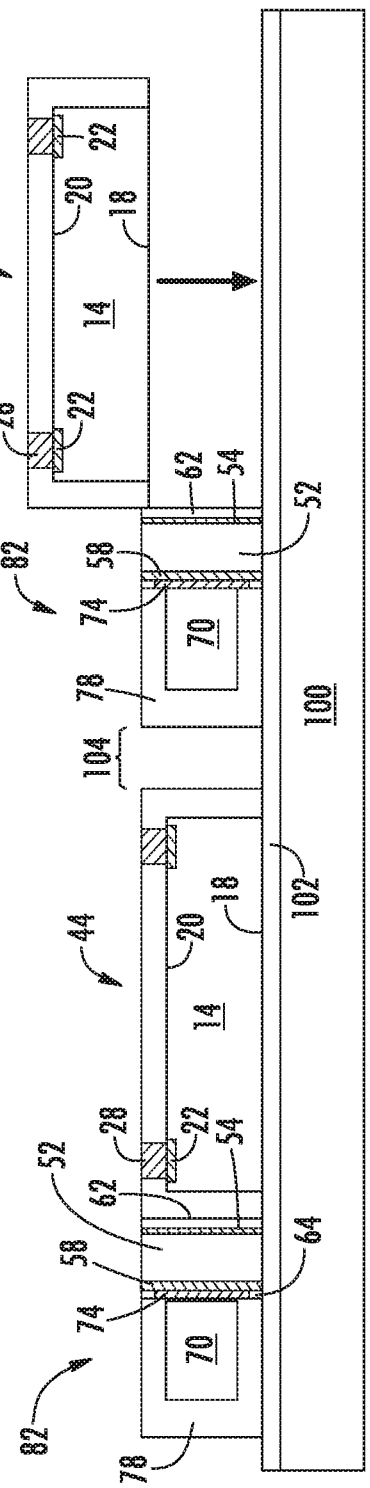
FIG. 3A
FIG. 3B

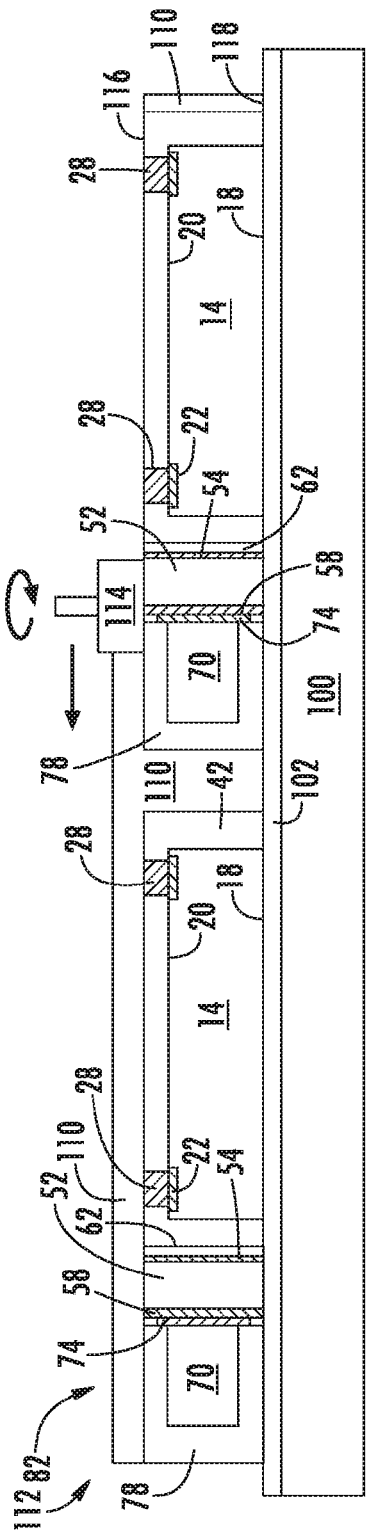
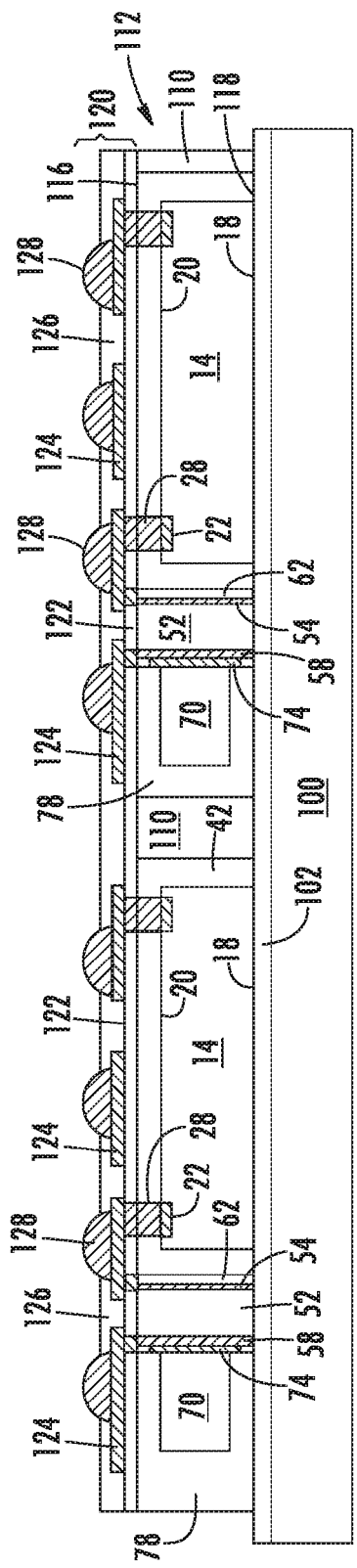

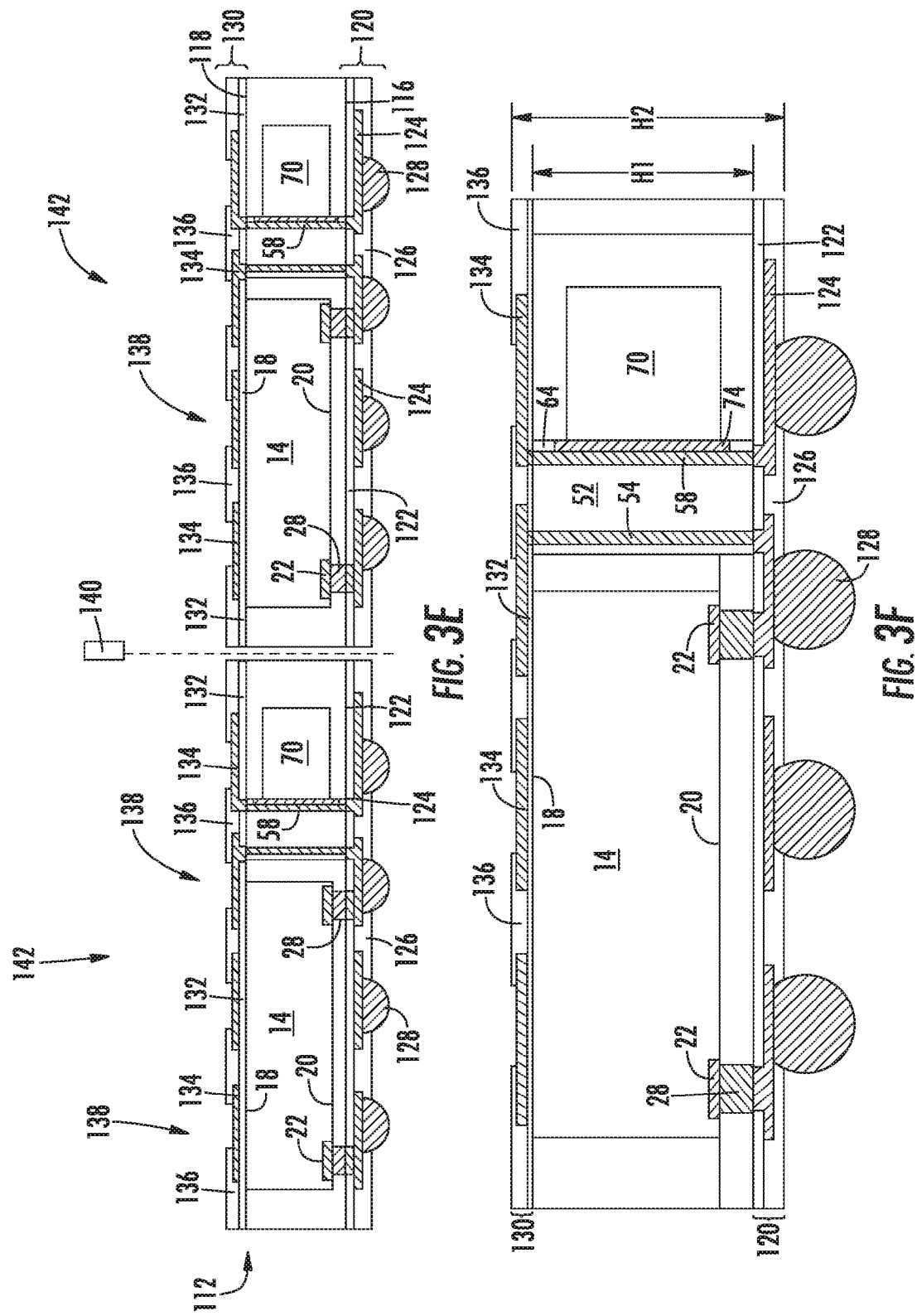

3D INTERCONNECT COMPONENT FOR FULLY MOLDED PACKAGES

CROSS-REFERENCE TO RELATED APPLICATIONS

This disclosure claims the benefit, including the filing date, of U.S. Provisional Patent No. 62/154,218, entitled "3D Interconnect Component for Fully Molded Packages," which was filed on Apr. 29, 2015, the disclosure of which are hereby incorporated herein by this reference.

TECHNICAL FIELD

The disclosure relates to three-dimensional (3D) interconnect components or component assemblies for fully molded packages, including rotated solderable component assemblies. The fully molded packages can comprise a plurality of integrated semiconductor devices, including component assemblies, for wearable technology, for the internet-of-things (IoT) devices, or both.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Back-end processing of semiconductor die can also include integration of a number of surface mount devices (SMD), passive components, or both, that are used to connect semiconductor die or integrated circuits to surfaces of substrates and PCBs without the use of through holes in the PCBs. Quad Flat Packages (QFP) use SMD that includes leads that extend from each of the four sides of the package, sometimes referred to as "gull wing leads." QFP leads provide electrical Input/Output (I/O) interconnection between the semiconductor die within the package and the PCB or substrate to which the QFP is mounted. Other SMD packages are made without leads and are commonly referred to flat no lead packages. Examples of flat no lead packages are Quad-flat no leads packages (QFNs) and dual-flat no lead (DFN) packages. QFN packages conventionally include a semiconductor die connected by wirebonds to a leadframe that is used for package I/O interconnection.

Integration of passive components in fan-out wafer level packages (FO-WLPs) is typically done by placing the passive components directly onto temporary carrier tape prior to molding or encapsulating the passive components. In the case of Embedded Wafer Level Ball Grid Array (eWLB) an active surface of a semiconductor die as well as the passive components can be attached to tape and then overmolded or encapsulated to form and reconstituted wafer or panel. After releasing the tape, terminals or contact pads of the semiconductor die and passive components can be exposed, and a redistribution layer can be applied to the panel such that conductive traces can make connection to the passive components. Commonly, SMD passives that are soldered to the substrate are attached on a core layer within a substrate to form an application of an embedded die in the substrate.

SUMMARY

On opportunity exists for improved semiconductor manufacturing. Accordingly, in one aspect, a method of making a semiconductor component package can comprise providing a substrate comprising conductive traces, soldering a plurality of surface mount devices (SMDs) to the substrate with solder, encapsulating the plurality of SMDs on the substrate with a first mold compound over and around the plurality of SMDs, and singulating the plurality of SMDs by separating the substrate to expose the conductive traces and to form a plurality of component assemblies comprising exposed conductive traces at a first side of the component assemblies and at a second side of the component assemblies opposite the first side of the component assemblies. The method can further include providing a temporary carrier, mounting at least one of the component assemblies to the temporary carrier with the first side of the at least one component assemblies and the exposed conductive traces oriented towards the temporary carrier, mounting a semiconductor die comprising a conductive interconnect to the temporary carrier adjacent to the at least one of the component assemblies, encapsulating the at least one of the component assemblies and the semiconductor die with a second mold compound while the at least one singulated component assembly and the semiconductor die are mounted to the temporary carrier to form a reconstituted panel, and exposing the conductive interconnect and the exposed conductive traces at the first side or the second side of the at least one component assemblies with respect to the second mold compound. The method can further include forming a first redistribution layer over the second mold compound to electrically connect the conductive interconnect and the exposed conductive traces, and singulating the reconstituted panel.

The method of making a semiconductor component package can further comprise the substrate comprising a two-layer laminate layer, a printed circuit board (PCB), or a blank mold compound panel. The component assemblies can comprise passive devices. The semiconductor die can be an embedded semiconductor die comprising the conductive interconnect coupled to the semiconductor die and exposed with respect to the second mold compound. The conductive interconnect can comprise copper bumps, pillars, posts, or thick RDL traces. The solder coupling the at least one of the singulated component assemblies to the substrate can be contained within, and not exposed with respect to, the semiconductor component package.

In another aspect, a method of making a semiconductor component package can comprise providing a substrate comprising conductive traces, attaching a SMD to the substrate with solder to form a component assembly, mounting the component assembly to a temporary carrier with a first side of the component assembly oriented towards the temporary carrier, mounting a semiconductor die comprising a conductive interconnect to the temporary carrier adjacent the component assembly, encapsulating the component assembly and the semiconductor die with a mold compound while the component assembly and the semiconductor die are mounted to the temporary carrier to form a reconstituted panel, and exposing the conductive interconnect and the conductive traces at the first side or the second side of the component assembly with respect to the mold compound.

The method of making a semiconductor component package can further comprise the substrate comprising a two-layer laminate layer, a PCB, or a blank mold compound panel. The SMD can be encapsulated on the substrate with additional mold compound over and around the SMD before mounting the component assembly to the temporary carrier. The semiconductor die can be an embedded semiconductor die comprising the conductive interconnect coupled to the semiconductor die and exposed with respect to the mold compound, wherein the conductive interconnect comprises copper bumps, pillars, posts, or thick RDL traces. The solder coupling the component assembly to the substrate can be contained within, and not exposed with respect to, the component assembly. The conductive interconnect and the conductive traces can be exposed by removing the temporary carrier from the reconstituted panel and grinding the reconstituted panel. A first redistribution layer can be formed over the reconstituted panel to electrically connect the conductive interconnect and the conductive traces, and a second redistribution layer can be formed opposite the first redistribution layer to electrically connect with the exposed conductive traces to form an electrical connection through a thickness of the semiconductor component package.

In another aspect, a method of making a semiconductor component package can comprise providing a substrate comprising conductive traces, attaching a SMD to the substrate with solder, mounting the SMD and substrate to a temporary carrier, mounting a semiconductor die comprising a conductive interconnect adjacent the SMD, dispensing mold compound over the temporary carrier, and exposing the conductive interconnect and the conductive traces with respect to the mold compound.

The method of making a semiconductor component package can further comprise mounting the semiconductor die comprising the conductive interconnect adjacent the temporary carrier. The semiconductor die comprising the conductive interconnect can be mounted adjacent the SMD. Mold compound can be dispensed to encapsulate the SMD and the semiconductor die thereby forming a reconstituted panel. The method can further comprise singulating the substrate to expose the conductive traces at a first side of the substrate, and mounting the SMD and substrate to the temporary carrier with the first side of the substrate and the exposed conductive traces oriented towards the temporary carrier. The substrate can comprise a two-layer laminate layer, a printed circuit board (PCB), or a blank mold compound panel. The conductive interconnect can comprise copper bumps, pillars, posts, or thick RDL traces.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

FIGS. 2A-2F illustrate the formation of component assemblies, SMD component assemblies, or 3D interconnect components.

FIGS. 3A-3F illustrate the formation of semiconductor component packages comprising solderable component assemblies, SMD component assemblies, or 3D interconnect components.

DETAILED DESCRIPTION

Figure 1:
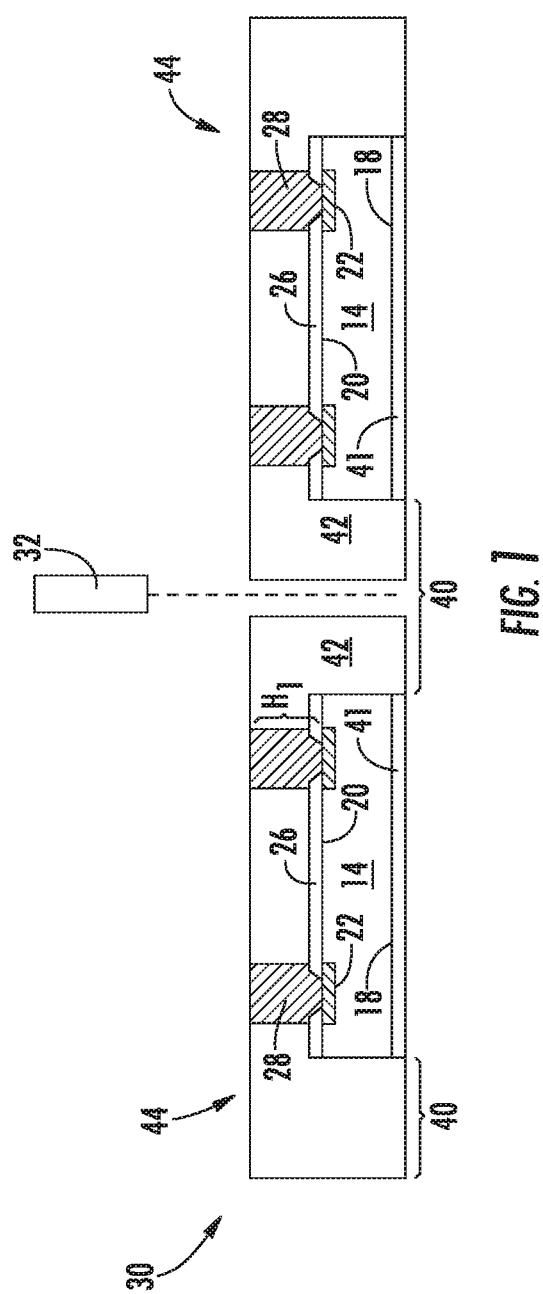
FIG. 1 illustrates embedded semiconductor die being singulated from a reconstituted panel 30.

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to a much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

However, when combining one or more semiconductor packages over a single substrate, forming an RDL layer over a standard solderable passive component with solder or tin (Sn) plated terminations can be impractical because the solder or Sn can melt during subsequent processing, causing electrical failures. Therefore, other alternatives are used to reduce failures, such as using more expensive components with bare Cu terminations rather than using Sn or solderable components, thereby reducing costs by reducing failures. Another alternative to the use of standard solderable passive components with solder or Sn soldering includes placement of SMD passives to a substrate core layer to form an embedded die, device, or component in the substrate, which allows for the use of solderable passive components while reducing risk of melting solder and Sn during subsequent processing, and the resultant failures. However, placement of the SMD passives within the substrate can increase the thickness of the package and can require a much larger area of prefabricated substrate, which increases size and costs, both of which are undesirable.

FIG. 1 shows a cross-sectional view of a plurality of semiconductor die 14 that have been formed according to front-end manufacturing methods and procedures as outlined above and included within a reconstituted panel, panel, reconstituted wafer, or wafer 30. More specifically, the semiconductor die 14 can be formed from, or as part of, a semiconductor wafer or native wafer with a base substrate material, such as, without limitation, silicon, germanium, gallium arsenide, indium phosphide, or silicon carbide, for structural support. A plurality of semiconductor die or components 14 can be formed on the native wafer and can be separated by a non-active, inter-die wafer area or saw street as described above. Saw streets provide cutting areas to singulate the semiconductor wafer into individual semiconductor die 14 for inclusion in a reconstituted panel or wafer 30, which can also include an embedded die panel.

Each semiconductor die 14 has a backside or back surface 18 and an active surface 20 opposite the backside 18. Active surface 20 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 20 to implement analog circuits or digital circuits, such as DSP, ASIC, memory, or other signal processing circuit. Semiconductor die 14 may also contain IPDs such as inductors, capacitors, and resistors, for RF signal processing.

An electrically conductive layer 22 is formed over active surface 20 using PVD, CVD, electrolytic plating, electroless plating process, or other suitable metal deposition process. Conductive layer 22 can be one or more layers of aluminum (Al), copper (Cu), Sn, nickel (Ni), gold (Au), silver (Ag), or other suitable electrically conductive material. Conductive layer 22 operates as contact pads or bond pads electrically coupled or connected to the circuits on active surface 20. Conductive layer 22 can be formed as contact pads disposed side-by-side a first distance from the edge of semiconductor die 14, as shown in FIG. 1. Alternatively, conductive layer 22 can be formed as contact pads that are offset in multiple rows such that a first row of contact pads is disposed a first distance from the edge of the die, and a second row of contact pads alternating with the first row is disposed a second distance from the edge of the die.

FIG. 1 also shows an optional insulating or passivation layer 26 conformally applied over active surface 20 and over conductive layer 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, semiconductor die 14 are packaged without the use of any PBO layers, and insulating layer 26 can be formed of a different material or omitted entirely. In another embodiment, insulating layer 26 includes a passivation layer formed over active surface 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1 also shows conductive interconnects or electrical interconnect structures 28 that can be formed as columns, pillars, posts, thick RDLS, bumps, or studs that are formed of copper or other suitable conductive material, which are disposed over, and coupled or connected to, conductive layer 22. Conductive interconnects 28 can be formed directly on conductive layer 22 using patterning and metal deposition processes such as printing, PVD, CVD, sputtering, electrolytic plating, electroless plating, metal evaporation, metal sputtering, or other suitable metal deposition process. Conductive interconnects 28 can be one or more layers of Al, Cu, Sn, Ni, Au, Ag, palladium (Pd), or other suitable electrically conductive material and can include one or more UBM layers. In some embodiments, conductive interconnects 28 can be formed by depositing a photoresist layer over the semiconductor die 14 and conductive layer 22. A portion of the photoresist layer can be exposed and removed by an etching development process, and the conductive interconnects 28 can be formed as copper pillars in the removed portion of the photoresist and over conductive layer 22 using a selective plating process. The photoresist layer can be removed leaving conductive interconnects 28 that provide for subsequent mechanical and electrical interconnection and a standoff with respect to active surface 20. Conductive interconnects 28 can include a height H1 in a range of 10-100 micrometers (μm) or a height in a range of 20-50 μm, or a height of about 35 μm.

An encapsulant 42 can be deposited around a plurality of semiconductor die 14 using a paste printing, compression molding, transfer molding, liquid encapsulant molding, lamination, vacuum lamination, spin coating, or other suitable applicator. The encapsulant 42 can be a polymer composite material, such as epoxy resin with filler, epoxy acrylate with filler, or polymer with proper filler. Semiconductor die 14 can be embedded together in encapsulant 42, which can be non-conductive and environmentally protect the semiconductor die 14 from external elements and contaminants.

The orientation of semiconductor die 14 can be either face up with active surface 20 oriented away from a carrier to which the semiconductor die 14 are mounted, or alternatively can be mounted face down with active surface 20 oriented toward the carrier to which the semiconductor die 14 are mounted. Accordingly, adhesive 41 can included or omitted from over back surface 18 of semiconductor die 14, depending on the process used for encapsulating the semiconductor die 14 and forming the panel 30 comprising semiconductor die 14 fully molded in a core of encapsulant 42 or within an epoxy core.

The panel 30 can optionally undergo a curing process to cure encapsulant 42. A surface of encapsulant 42 can be substantially coplanar with adhesive 41. Alternatively, encapsulant 42 can be substantially coplanar with backside 18, the encapsulant being exposed by the removal of carrier and interface layer. The panel 30 can include a footprint or form factor of any shape and size including circular, rectangular, or square, such as a form factor similar to the form factor of a 300 millimeter (mm) semiconductor wafer including a circular footprint having a diameter of 300 mm. Any other desirable size can also be formed.

The panel 30 can undergo an optional grinding operation with a grinder to planarize the surface and reduce a thickness of the panel 30. A chemical etch can also be used to remove and planarize a portion of encapsulant 42 in panel 30. Thus, a surface of conductive interconnects 28 can be exposed with respect to encapsulant 42 at an edge or periphery of panel 30 to provide for electrical connection between semiconductor die 14 and a subsequently formed redistribution layer or interconnect structure. The panel 30 can be singulated through gaps or saw streets 40 using a saw blade or laser cutting tool 32 into individual embedded semiconductor die 44. The embedded semiconductor die 44 can then be used as part of a subsequently formed semiconductor component package as discussed in greater detail below. However, the embedded semiconductor die 44 can also be fully testable after conductive interconnects 28 are applied and before the embedded semiconductor die 44 are singulated from panel 30 or assembled into the reconstituted panel 112 shown in FIG. 3C.

In some instances, the embedded semiconductor die 44 can be formed as described in U.S. patent application Ser. No. 13/632,062, now U.S. Pat. No. 8,535,978, entitled "Die Up Fully Molded Fan-out Wafer Level Packaging," which was filed on Apr. 29, 2015, the entirety of the disclosure of which is incorporated herein by this reference.

FIG. 2A shows a cross-sectional profile view of a substrate, laminate layer, printed circuit board (PCB), or blank mold compound panel 50. The substrate 50 can comprise conductive traces 54 formed over a first surface 56 of a substrate core or core material 52 and land pads 58 formed over a second surface 60 of the substrate core or core material 52 opposite the first surface 56. When the substrate 50 is formed as a blank mold compound panel, the core material 52 can comprise a material or material properties that are identical, similar, or functionally equivalent to one or more of encapsulant 42, the encapsulant or first mold compound 78, or the second encapsulant or mold compound 110.

The conductive traces 54 and the land pads 58 can be patterned and deposited over the substrate core 52 of the substrate 50. In some instances, conductive traces 54 can be formed as one or more redistribution layers (RDL) or RDL patterns on both, that can be formed on or over only the first surface 56, only the second surface 60, or both the first surface 56 and the second surface 60. Similarly, the land pads 58 can be formed on or over only the first surface 56, only the second surface 60, or both the first surface 56 and the second surface 60.

The conductive traces 54, the land pads 58, or both, can be one or more layers of Al, Cu, Sn, Ni, Au, Ag, Ti/Cu, TiW/Cu, or a coupling agent/Cu or other suitable electrically conductive material. The conductive traces 54, the land pads 58, or both, can be formed using PVD, CVD, electrolytic plating, electroless plating, or other suitable process. In an embodiment, conductive traces 54, the land pads 58, or both, can be comprise a Ti barrier layer, a Cu seed layer, and Cu layer formed over the Ti barrier layer and the Cu seed layer and can provide electrical interconnection with a component subsequently mounted to the substrate or laminate layer 50. In some instances, the substrate or laminate layer 50 can be purchased or acquired as a pre-formed or premade item, and the 2-layer laminate substrate 50 can comprise a core 52 of, or about, 130 micrometers (μm), such as in a range of 30-200 μm.

An insulating or passivation layer 62 can be disposed over the conductive traces 54 and the first surface 56. Similarly, an insulating or passivation layer 64 can be disposed over the land pads 58 and the second surface 60. The insulating layers 62 and 64 can be one or more layers of SiO2, Si3N4, SiON, Ta2O5, Al2O3, polyimide, BCB, PBO, epoxy, a soldermask material, or other material having similar insulating and structural properties formed by PVD, CVD, screen printing, spin coating, spray coating, lamination, sintering, or thermal oxidation. In some instances, the insulating or passivation layers 62 and 64 can be included with the pre-formed or premade substrate or laminate layer 50. Openings 68 in the insulating layer 64 can be formed over portions of land pads 58 to facilitate subsequent electrical interconnection with one or more terminals or contact pads 72 on surface mount devices (SMD) like SMDs 70 shown in FIG. 2B.

FIG. 2B shows terminals 72 of SMDs 70 being surface mounted to the substrate or laminate layer 50 using solder or solder paste 74. SMDs 70 can be of a desirable size and comprise passive components, active components, solderable passives such as resistors or capacitors, other semiconductor die, ICs, wafer level chip scale packages (WLCSPs) and other components. A size of the SMDs 70 can be according to JDEC standard sizing, either with a metric code or an imperial code, where the metric code gives a length and width of the SMD component in tenths of millimeters and the imperial code gives the length and width of the SMD component in hundredths of inches, with some exceptions. In some instances, an 0201 SMD package size can be used, which comprise dimensions of about 0.25 mm×0.125 mm (or 0.0098 in×0.0049 in.). In other instances, dimensions of the 0201 package can comprise dimensions of 0.6 mm×0.3 mm (or 0.024 in×0.012 in). In any event, a size of the SMD can, in certain instances, be selected to be consistent with an overall configuration and design of a final package as described in greater detail below.

The solder 74 can be placed on land pads 58 to facilitate electrical communication between the SMDs 70 and the substrate 50. The solder 74 can comprise Al, Sn, Ni, Au, Ag, Pb, Bi, Cu, solder, and combinations thereof, with an optional flux solution. For example, the solder 74 can be eutectic Sn/Pb, high-lead solder, or lead-free solder. The solder 74 can be deposited over the substrate 50 and on the land pads 58 using evaporation, electrolytic plating, electroless plating, ball drop, or screen printing process. In some embodiments, solder 74 is Sn solder paste that is deposited over the substrate 50 and on the land pads 58 using screen printing. After the SMDs 70 are coupled to the substrate 50 with the solder 74, the solder 74 can undergo a reflow process or be reflowed to improve to improve electrical contact between the SMDs 70 and the land pads 58. After reflow, the substrate 50 and SMDs 70 can optionally undergo one or more of an aqueous clean, an automated optical inspection (AOI), and a plasma clean.

FIG. 2C shows a first encapsulant or mold compound 78 can optionally be deposited around the plurality of SMDs 70 using a paste printing, compression molding, transfer molding, liquid encapsulant molding, lamination, vacuum lamination, spin coating, or other suitable applicator. The encapsulant 78 can be a polymer composite material, such as epoxy resin with filler, epoxy acrylate with filler, or polymer with proper filler. In some instances, the encapsulant 78 can be the same or similar as the encapsulant 42 used in forming embedded semiconductor die 44. SMDs 70 can be embedded together on the substrate 50 in encapsulant 78, which can be non-conductive and environmentally protect the SMDs 70 from external elements and contaminants. After molding or encapsulation, the molded substrate 50 and SMDs 70 can undergo a post molding clean (PMC), and testing to identify and mark any bad, defective, or inoperative SMDs 70 within the molded substrate. While the encapsulant or first mold compound 78 is shown being formed or disposed around the SMDs 70 to facilitate or make easier the mounding of final component assembly 82 to the temporary carrier 100, as shown in FIG. 3A, the encapsulant or first mold compound 78 can be optional and can be omitted entirely. With the encapsulant or first mold compound 78 being completely optional in some embodiments, mounting of the final component assemblies 82 to the temporary carrier 100 can be done without the presence of the encapsulant or first mold compound 78.

As shown in FIG. 2D, the molded substrate 50 can then be singulated between SMDs 70 using a saw blade or laser cutting tool 80 into individual component assemblies, SMD component assemblies, or 3D interconnect components 82 comprising a mold cap of encapsulant 78. Singulation of the molded substrate 50 can separate the substrate 50 to expose the conductive traces 54 and to form a plurality of component assemblies or SMD component assemblies 82. The component assemblies 82 can comprise exposed conductive traces 84, comprised of conductive traces 54, land pads 58, or both. The exposed conductive traces 84 can be exposed only at a first side 86 of the component assemblies 82, only at a second side 88 of the component assemblies 82, or at both the first side 86 and the second side 88, wherein the first side 86 can be opposite the second side 88. For mounting the component assemblies 82, the first side 86 and the second side 88 can be flat, planar, or substantially so. The component assemblies 82 can comprise a height H in a range of 0.4-0.8 mm, 0.5-0.7 mm, or about 0.6 mm, such as 0.62 mm. The height H can be the sum of a height of the molding compound Hm and a height of the substrate Hs. The height of the molding compound Hm can be in a range of 0.1-0.3 mm, or about 0.2 mm, such as 0.22 mm. The height of the molding compound Hs can be in a range of 0.2-0.6 mm, or about 0.4 mm. The component assemblies 82 can also comprise a length L in a range of 0.9-1.3 mm, 1.0-1.2 mm, or about 1.1 mm.

Figure 2E:
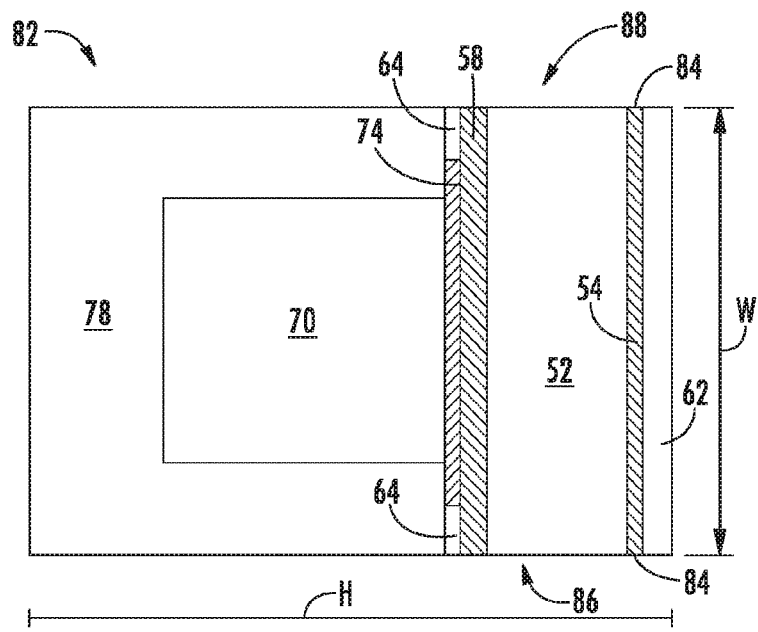

FIG. 2E shows a cross-sectional profile view of the component assembly 82 that illustrates a width W of the component assembly 82, and shows a direction of the component assembly 82 that is perpendicular or orthogonal to the view shown in FIG. 2D. The width W of the component assembly 82 can be in a range of 0.2-0.6 mm, 0.3-0.5 mm, or about 0.4 mm, such as 0.43 mm. While the exemplary measurements for the length L, width W, and height H of the component assembly 82 are given with respect to 0201 SMDs 70, SMDs of different sizes can also be used, which would result in corresponding differences in the sizes of the length L, width W, and height H of the component assembly 82. The view of FIG. 2E also shows the exposed conductive traces 84 at the first side 86 of the component assembly 82 and the second side 88 of the component assembly 82, which can be used for subsequent electrical connection and package integration, as discussed with respect to FIGS. 3A-3F.

Figure 2F:
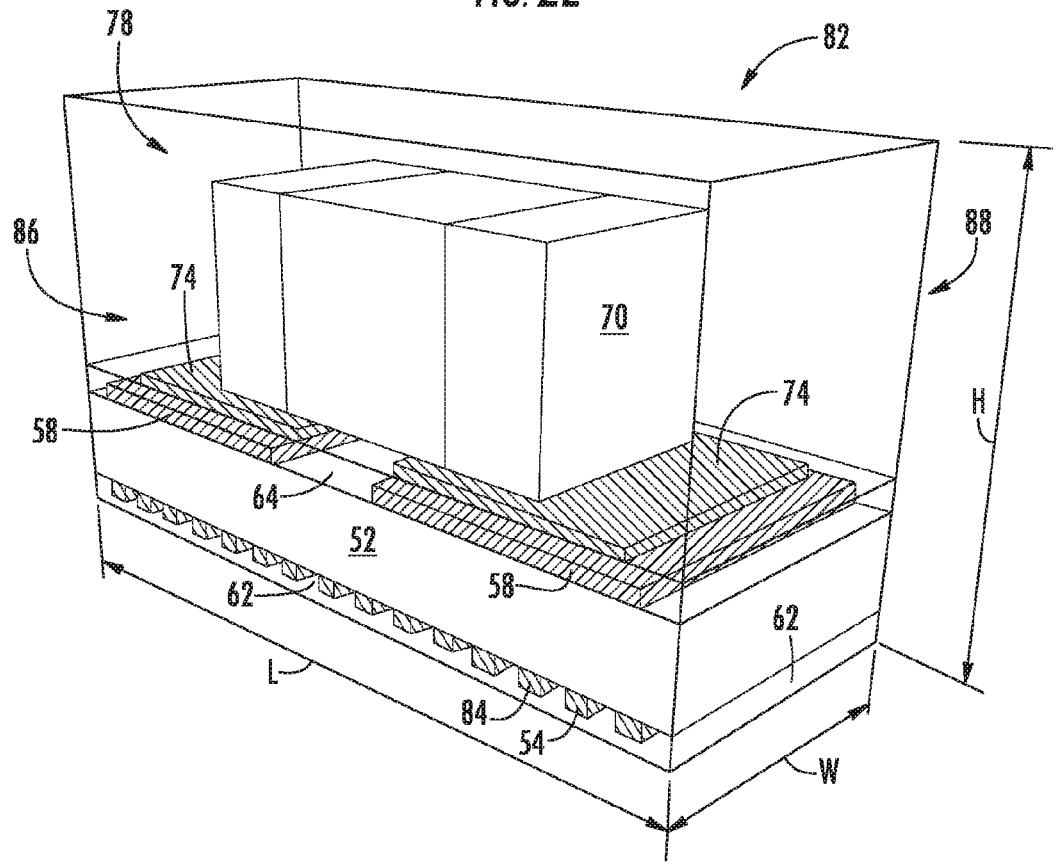

FIG. 2F shows a perspective view of the component assembly 82 in which the exposed conductive traces 84 at the first side 86 of the component assembly are visible. FIG. 2F also shows the relative positioning and orientation of the length L, width W, and height H of the component assembly 82.

FIG. 3A shows a temporary carrier or substrate 100 containing temporary or sacrificial base material such as silicon, polymer, stainless steel, or other suitable low-cost, rigid material for structural support. An optional interface layer or double-sided tape 102 can be formed over the temporary carrier 100 as a temporary adhesive bonding film or etch-stop layer. In an embodiment, the carrier 100 can be a ring-shaped film frame comprising an open center portion that supports tape 102 at a periphery of the tape.

One or more component assemblies 82, such as a plurality, can be mounted to the temporary carrier 100 and interface layer 102 with the first side 86 of the component assemblies 82 and the exposed conductive traces 84 oriented towards the temporary carrier 100, and the conductive traces 54 in a vertical orientation. Correspondingly, the second side 88 of the component assemblies 82 and opposite ends of the exposed conductive traces 84 can be oriented away from the temporary carrier 100, or facing up, for subsequent vertical interconnection within a final semiconductor component package. Thus, the component assemblies 82 can be perpendicular from, or rotated by 90 degrees with respect to, the horizontal position maintained on the unsingulated substrate 50. As such, the conductive traces 54 can assume a vertical orientation when mounted on the temporary carrier 100, rather than the horizontal orientation maintained when part of the unsingulated substrate 50, with both sides of the component assemblies 82 comprising exposed conductive traces 84, exposed land pads 58, or both.

FIG. 3B shows embedded semiconductor die 44 from FIG. 1 mounted face up to temporary carrier 100 and interface layer 102 with backside 18 oriented towards the temporary carrier 100 and active surface 20 oriented away from the temporary carrier 100. Semiconductor die 14 can be placed over the temporary carrier 100 using a pick and place operation or other suitable operation. An adhesive 41, as shown in FIG. 1, can be optionally disposed between backside 18 of semiconductor die 14 and the temporary carrier 100. The adhesive 41, when present, can be thermal epoxy, epoxy resin, B-stage epoxy film, ultraviolet (UV) B-stage film with optional acrylic polymer, or other suitable material. In an embodiment, adhesive 41 can be disposed over backside 18 before semiconductor die 14 are mounted over the temporary carrier 100. Alternatively, the adhesive 41 can be disposed over the temporary carrier 100 before mounting the embedded semiconductor die 44 to the temporary carrier 100. In other embodiments, the embedded semiconductor die 41 can be mounted directly to interface layer or support tape 102 or temporary carrier 100 without use of adhesive 41.

Each embedded semiconductor die 44 can be mounted to the temporary carrier 100 adjacent, or in lateral contact with, a corresponding component assembly 82. Pairs of embedded semiconductor die 44 and component assemblies 82 can be separated by a space or gap 104 when mounted over the temporary carrier 100 to provide for a saw street or separation 104 of subsequently formed semiconductor component packages. In some instances, a portion of the space 104 can be used for a subsequently formed fan-out interconnect structure. While FIGS. 3A and 3B show the component assemblies 82 mounted to the temporary carrier 100 before the embedded semiconductor die 44, in other instances the embedded semiconductor die 44 can be first mounted to the temporary carrier 100 followed by the component assemblies 82. In mounting the embedded semiconductor die 44 and the component assemblies 82 to the temporary carrier 100, the component assemblies 82 can also be mounted, coupled, or attached to the embedded semiconductor die 44. For mounting, the component assemblies 82 can also be turned on their sides, such as with their first sides 86 oriented towards the temporary carriers 100 so that the conductive traces 54 are oriented vertically instead of horizontally, so that the conductive traces 54 can provide vertical interconnect through a final semiconductor component package 142 extending completely between a front surface 116 and a back surface 118 of the reconstituted panel 112 or semiconductor component package 142. In other instance, the component assemblies and SMDs 70 can be horizontally mounted, or mounted with a rotation of 90 degrees with respect to that shown in FIG. 3B, so that the conductive traces 54 are parallel or substantially parallel with the temporary carrier 100, such as within 0-10 degrees, 0-5 degrees, or 0-1 degree.

FIG. 3C shows encapsulating a plurality of component assemblies 82 and embedded semiconductor die 44 or semiconductor die 14 with a second encapsulant or mold compound 110 that is formed around the component assemblies 82, the embedded semiconductor die 44 or semiconductor die 14, and within the space 104, while the singulated component assemblies 82, embedded semiconductor die 44, and semiconductor die 14 are mounted to the temporary carrier 100 to form a reconstituted panel or wafer 112. The second encapsulant 110 can be similar or identical to the first encapsulant 78, the encapsulant 42, or both, and can be deposited using a paste printing, compression molding, transfer molding, liquid encapsulant molding, lamination, vacuum lamination, spin coating, or other suitable applicator. The second encapsulant 110 can be a polymer composite material, such as epoxy resin with filler, epoxy acrylate with filler, or polymer with proper filler, which can be non-conductive and environmentally protect the embedded semiconductor die 44 and the component assemblies 82 from external elements and contaminants. In some instances, the reconstituted panel or wafer 112 can also include at least one via or vertical interconnect within the substrate that extends between, and can be exposed at, the bottom surface 116 and the top surface 118 of the reconstituted panel 112.

The reconstituted panel 112 can undergo a grinding operation with grinder 114 to planarize a front surface 116 of reconstituted panel 112 and reduce a thickness of the reconstituted panel 112. A chemical etch can also be used to remove and planarize a portion of the reconstituted panel 112. The grinding operation can expose the conductive interconnects 28 of the embedded semiconductor die 44 as well as expose the exposed conductive traces 84 at the first side 86 of the component assemblies 82 with respect to the second encapsulant 110. The reconstituted panel 112 can also undergo a grinding operation with the grinder 114 to planarize a back surface 118 of the reconstituted panel 112 and reduce a thickness of the reconstituted panel 112. The grinding operation can also expose the exposed conductive traces 84 at the second side 88 of the component assemblies 82 with respect to the second encapsulant 110.

FIG. 3D shows a first build-up interconnect structure 120 formed over the front surface 116 of the reconstituted panel 112. The build-up interconnect structure 120 can comprise any desirable number of conductive and insulating layers depending on the configuration, design, and routing requirements of the final device or semiconductor component package 142. A non-limiting example of a build-up interconnect structure 120 is shown and described with respect to FIG. 3D. The build-up interconnect structure 120 can comprise an electrically conductive layer or redistribution layer (RDL) 124 that is patterned and deposited over embedded semiconductor die 44, including conductive interconnects 28, and component assemblies 82, including land pads 58 and exposed conductive traces 84. In some instances, the conductive layer 124 can be formed directly on, or in contact with, front surface 116 of the reconstituted panel 112. In other instances, an intermediate insulating or passivation layer 122 can be formed on, or disposed between, the conductive layer 124 and the front surface 116. When the intermediate insulating or passivation layer 122 is present, the insulating layer 122 can be one or more layers of SiO2, Si3N4, SiON, Ta2O5, Al2O3, polyimide, BCB, PBO or other material having similar insulating and structural properties formed by PVD, CVD, screen printing, spin coating, spray coating, sintering, or thermal oxidation.

The conductive layer 124 can be one or more layers of Al, Cu, Sn, Ni, Au, Ag, Ti/Cu, TiW/Cu, or a coupling agent/Cu or other suitable electrically conductive material. The conductive layer 124 can be formed using PVD, CVD, electrolytic plating, electroless plating, or other suitable process. In an embodiment, conductive layer 124 is an RDL comprising a TiW seed layer, a Cu seed layer, and Cu layer formed over the TiW seed layer and the Cu seed layer. Conductive layer 124 can provide electrical interconnection between conductive interconnects 28, land pads 58, exposed conductive traces 84, and other features within the completed semiconductor component package 142 for the transmission of electrical signals among points within the completed semiconductor component package.

When positions of embedded semiconductor die 44 and component assemblies 82 shift from nominal positions such as during placement and encapsulation on temporary carrier 100 for formation of the reconstituted panel 112, the true or actual positions of the embedded semiconductor die 44 and component assemblies 82 may not sufficiently align with the nominal design of the build-up interconnect structure 120 or conductive layer 124 to provide desired reliability for package interconnections given desired routing densities and pitch tolerances. When shifts in the positions of embedded semiconductor die 44 and component assemblies 82 are small, no adjustments to the positions of conductive layer 124 may be required to properly align the conductive layer 124 with the embedded semiconductor die 44 and component assemblies 82. However, when changes in the positions of embedded semiconductor die 44 and component assemblies 82 within the reconstituted panel 112 are such that the nominal positions do not provide adequate alignment with, and exposure to, the conductive layer 122, then adjustments to portions of the build-up interconnect structure 120 can be made by Adaptive Patterning™ or unit specific patterning (hereinafter, "unit specific patterning") as described in greater detail in U.S. patent application Ser. No. 13/891,006, filed May 9, 2013, the disclosure of which is hereby incorporated by reference. As such, a position, an alignment, or a position and alignment of interconnect structure 120 and conductive layer 124 can be adjusted by an x-y translation, by rotation of an angle θ, by both, or by customized routing with respect to their nominal positions or with respect to a point of reference or fiducial on the reconstituted panel 112, thereby maintaining a constant alignment between the embedded semiconductor die 44 and the module package outline as well as and component assemblies 82 and the module package outline.

FIG. 3D further shows insulating or passivation layer 126 is conformally applied over and contacts conductive layer 124 and insulating layer 122, if present. Insulating layer 126 can be one or more layers of SiO2, Si3N4, SiON, Ta2O5, Al2O3, polyimide, BCB, PBO, dry film resist layer, or other material having similar insulating and structural properties, that are applied using PVD, CVD, screen printing, spin coating, spray coating, sintering, thermal oxidation, or other suitable process. Insulating layer 126 can be patterned and a portion the insulating layer 126 can be removed by etching, laser drilling, mechanical drilling, or other suitable process to form openings completely through the insulating layer 126 to expose the conductive layer 124. The openings in the insulating layer 126 can be for reception of bumps, balls, or interconnect structures 128.

Bumps 128 can be formed by depositing an electrically conductive bump material over portions of conductive layer 124, which can be formed as under bump metallization (UBM) pads, using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to conductive layer 124 using a suitable attachment or bonding process. In an embodiment, the bump material can be reflowed by heating the material above its melting point to form bumps 128. In some applications, bumps 128 are reflowed a second time to improve electrical contact to conductive layer 124. Bumps 128 can also be compression bonded or thermocompression bonded to conductive layer 124. Bumps 128 represent a type of interconnect structure that can be formed over conductive layer 124. Bumps 128 can also comprise stud bumps, micro bumps, or other electrical interconnects.

FIG. 3E shows the reconstituted panel 112 with the first build-up interconnect structure 120 being formed thereon, and the reconstituted panel 112 being removed from the temporary carrier 100, after which the temporary carrier can optionally undergo a grinding operation similar to the grinding operation of FIG. 3C, but at the back surface 118 rather than at the front surface 116, to planarize the back surface 118, to a reduce a thickness of the reconstituted panel 112, and to expose the exposed conductive traces 84 at the second side 88 of the component assemblies 82 with respect to the second encapsulant 110 or the back surface 118. As such, in various embodiments the exposed conductive traces 84, like conductive traces 54 and land pads 58, can be exposed at only a the first side 86, at only the second side 88, or can be exposed at both the first side 86 and the second side 88. In some instances, exposure of the exposed conductive traces 84 is with respect to the second encapsulant 110, while in other instances the exposed conductive traces 84 are exposed with respect to first side 86, the second side 88, or both.

With the exposed conductive traces 84 exposed at the second side 88 of the component assemblies 82, a second build-up interconnect structure 130 can be formed over the back surface 118 of the reconstituted panel 112. The build-up interconnect structure 130 can comprise any desirable number of conductive and insulating layers depending on the configuration, design, and routing requirements of the final device or semiconductor component package 142. A non-limiting example of a build-up interconnect structure 130 is shown and described with respect to FIG. 3E. The build-up interconnect structure 130 can comprise an electrically conductive layer or redistribution layer (RDL) 134 that is patterned and deposited over embedded semiconductor die 44 and over component assemblies 82, including and land pads 58 and exposed conductive traces 84. In some instances, the conductive layer 134 can be formed directly on, or in contact with, back surface 118 of the reconstituted panel 112. In other instances, an intermediate insulating or passivation layer 132 can be formed on, or disposed between, the conductive layer 134 and the back surface 118. When the intermediate insulating or passivation layer 132 is present, the insulating layer 132 can be one or more layers of SiO2, Si3N4, SiON, Ta2O5, Al2O3, polyimide, BCB, PBO or other material having similar insulating and structural properties formed by PVD, CVD, screen printing, spin coating, spray coating, sintering, or thermal oxidation.

The conductive layer 134 can be one or more layers of Al, Cu, Sn, Ni, Au, Ag, Ti/Cu, TiW/Cu, or a coupling agent/Cu or other suitable electrically conductive material. The conductive layer 134 can be formed using PVD, CVD, electrolytic plating, electroless plating, or other suitable process. In an embodiment, conductive layer 134 is an RDL or fan-out RDL comprising a TiW seed layer, a Cu seed layer, and Cu layer formed over the TiW seed layer and the Cu seed layer. Conductive layer 134 can provide electrical interconnection between land pads 58, exposed conductive traces 84, and other features within the completed semiconductor component package 142 for the transmission of electrical signals among points within the completed semiconductor component package.

When positions of embedded semiconductor die 44 and component assemblies 82 shift from nominal positions such as during placement and encapsulation on temporary carrier 100 for formation of the reconstituted panel 112, the true or actual positions of the embedded semiconductor die 44 and component assemblies 82 may not sufficiently align with the nominal design of the build-up interconnect structure 130 or conductive layer 134 to provide desired reliability for package interconnections given desired routing densities and pitch tolerances. When shifts in the positions of embedded semiconductor die 44 and component assemblies 82 are small, no adjustments to the positions of conductive layer 134 may be required to properly align the conductive layer 134 with the embedded semiconductor die 44 and component assemblies 82. However, when changes in the positions of embedded semiconductor die 44 and component assemblies 82 within the reconstituted panel 112 are such that the nominal positions do not provide adequate alignment with, and exposure to, the conductive layer 132, then adjustments to portions of the build-up interconnect structure 130 can be made by unit specific patterning. As such, a position, an alignment, or a position and alignment of interconnect structure 130 and conductive layer 134 can be adjusted by an x-y translation, by rotation of an angle θ, by both, or by customized routing with respect to their nominal positions or with respect to a point of reference or fiducial on the reconstituted panel 112, thereby maintaining a constant alignment between the embedded semiconductor die 44 and the module package outline as well as and component assemblies 82 and the module package outline.

FIG. 3E further shows an insulating or passivation layer 136 is conformally applied over, and contacts, conductive layer 134 and insulating layer 132, if present. The insulating layer 136 can be one or more layers of SiO2, Si3N4, SiON, Ta2O5, Al2O3, polyimide, BCB, PBO, dry film resist layer, or other material having similar insulating and structural properties, that are applied using PVD, CVD, screen printing, spin coating, spray coating, sintering, thermal oxidation, or other suitable process. Insulating layer 136 can be patterned and a portion the insulating layer 136 can be removed by etching, laser drilling, mechanical drilling, or other suitable process to form openings 138 completely through the insulating layer 136 to expose the conductive layer 134. The openings 138 in the insulating layer 136 can expose portions of the conductive layer 134 formed as package on package (POP) land pads or SMD land pads 139 on the top routing layer of the second build-up interconnect structure 130 for the reception of bumps, balls, or interconnect structures 128 as well as other devices, packages, SMDs, surface mount devices (SMDs), surface mount components (e.g. packaged ICs, passive components, connectors, mechanical parts, EMI shields), or the mounting to substrates or other devices.

After formation of the first build-up interconnect structure 120 and the second build-up interconnect structure 130, the reconstituted panel and first and second build-up interconnects 120 and 130 can be singulated using a saw blade or laser cutting tool 140 into individual semiconductor component packages 142.

FIG. 3F shows an enlarged view of a semiconductor package 142 from FIG. 3E. As shown, the reconstituted panel or wafer 112 can comprise a height H1 of about 0.43 mm, and the overall package height H2, which includes a height of the first build-up interconnect structure 120 and the second build-up interconnect structure 130, can be 0.5 mm, or about 0.5 mm, such as 0.3 mm-0.7 mm. The first build-up interconnect structure 120 and the second build-up interconnect structure 130 can be coupled to, and in direct electrical communication with, the through mold conductive traces 54 and the land pads 58 for the SMD 70, thereby providing vertical electrical interconnection between a bottom surface 144 of package 142 and a top surface 146 of the package 142. In some instances, component assemblies 82 can be sawn slightly larger than finished height or thickness H1 so that vertical through mold conductive traces 54 can be exposed in top and bottom grind steps, such as with grinder 114 as shown in FIG. 3C during the grinding of front surface 116, and the grinding of back surface 118 before the formation of the second build-up interconnect structure 130, as shown in FIG. 3E.

The improved integration and reduced size of semiconductor package 142, including the inclusion of component assembly 82 with solder or Sn connections 74, is well suited for miniature electronic systems such as smart watches and other IoT devices that require a reduced form factor or the smallest possible form factor. The method of embedding solderable components 82 within the core of 3D fan-out wafer level package or semiconductor component package 142 can include: attaching passive or active components 70 to a substrate or PCB strip 50 using solder reflow, overmolding the strip to encapsulate the components 70, dicing the strip to form discrete molded components 82, and placing at least one molded component assembly 82 on a temporary carrier 100 such that the conductive traces 54 within the component assemblies 82 are oriented vertically and a first side surface 86 is oriented towards and attached to the carrier 100.

The method can further include: placing at least one semiconductor die 14 with conductive interconnects 28 or plated Cu bumps on the temporary carrier tape 102 adjacent to the component assembly or molded passive 82, encapsulating the temporary carrier 100 to form a reconstituted panel or wafer 112, grinding the reconstituted panel 112 to expose both the conductive interconnects or Cu bumps 28 on the semiconductor die 14 and the conductive traces 54 within the molded component 82 (at least 2 of the conductive traces 54 being electrically connected to a SMD, passive component, or active component 70) without exposing the solder 74 that is embedded within the component assembly or molded component 82, and forming a first build-up interconnect structure or redistribution layer 120 on the reconstituted panel 112 to electrically connect at least one contact pad 22 on the semiconductor die 14 to at least one terminal 72 on a SMD or embedded passive component 70. Optionally, a second build-up interconnect structure or redistribution layer 130 can be formed on the opposite second surface or side 118 of the reconstituted panel 112 making contact to at least one of the conductive traces 54 within the component assembly or discrete molded component 82 such that an electrical connection is made through the height H1 or thickness of the semiconductor component package 142 to a contact or bond pad 22 on the semiconductor die 14.

As shown in FIG. 3F, the semiconductor component package 142 can comprise one or more semiconductor die 14 as well as SMD technology 70 that can include other semiconductor die, ICs, passive devices, wafer level chip scale packages (WLCSPs) and other components, mounted to the embedded semiconductor die 44 and included within the semiconductor component package 142 rather than having the SMDs 70 mounted to a conventional substrate or PCB and offset from a semiconductor die 14 or embedded semiconductor die 44 that is also mounted to a conventional substrate or PCB.

Therefore, the semiconductor component package 142 can provide a number of advantages, including: integration and use of standard, low-cost 0201 passives with Sn terminations, SMDs 70 comprising a flat first side surface 86 for easy mounting to interface layer or carrier tape material 102, conductive traces 54 that serve or operate as a 3D or vertical interconnect structures through the height H1 of the semiconductor component package 142 for PoP configurations, 0201 passives integrated within 0.5 mm body thickness, compatibility with fully molded wafer level fan-out semiconductor package design (including Deca M-Series™ packages), and external component assembly that does not require additional internal process or equipment and that also does not require an additional cycle time.

In some variations of the semiconductor component package 142, the length L of the component assembly 82 can be extended and include more SMDs or passives 70 and more through mold conductive traces 54. In some instances, the substrate 50 can be formed as a multi-layer substrate to add additional through mold conductive traces 54. In other instances, SMDs or passives 70 can be mounted over opposing first and second opposing surfaces 56 and 60 of substrate 50 or substrate core 52. When SMDs 70 are mounted over opposing surfaces of the substrate 50, one or both sides of the substrate 50 with the SMDs 70 can be molded or encapsulated. In yet other instances, small active Si semiconductor die can be incorporated on substrate 50 with SMDs 70. Additionally, in instances when SMDs 70 are included within semiconductor component packages 142 comprising a single side (2D) package structure, the 2D package structure can be formed without a second built-up interconnect structure or RDL 130 such that the component assembly 82 can be mounted to interface layer or panel carrier tape 102 with a horizontal orientation and the substrate or leadframe 50 can be facing up so that POP or SMD land pads 139 are exposed during a panel grinding process or front grinding process as shown in FIG. 3C.

While this disclosure includes a number of embodiments in different forms, there is presented in the drawings and written descriptions in the following pages detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a semiconductor component package comprising:
   providing a substrate comprising conductive traces;
   soldering a plurality of surface mount devices (SMDs) to the substrate with solder;
   encapsulating the plurality of SMDs on the substrate with a first mold compound over and around the plurality of SMDs;
   singulating the plurality of SMDs by separating the substrate to expose the conductive traces and to form a plurality of component assemblies comprising exposed conductive traces at a first side of the component assemblies and at a second side of the component assemblies opposite the first side of the component assemblies;
   providing a temporary carrier;
   mounting at least one of the component assemblies to the temporary carrier with the first side of the at least one component assemblies and the exposed conductive traces oriented towards the temporary carrier;

mounting a semiconductor die comprising a conductive interconnect to the temporary carrier adjacent to the at least one of the component assemblies;

encapsulating the at least one of the component assemblies and the semiconductor die with a second mold compound while the at least one singulated component assembly and the semiconductor die are mounted to the temporary carrier to form a reconstituted panel;

exposing the conductive interconnect and the exposed conductive traces at the first side or the second side of the at least one component assemblies with respect to the second mold compound;

forming a first redistribution layer over the second mold compound to electrically connect the conductive interconnect and the exposed conductive traces; and singulating the reconstituted panel.

2. The method of claim 1, wherein the substrate comprises a two-layer laminate layer, a printed circuit board (PCB), or a blank mold compound panel.

3. The method of claim 1, wherein the component assemblies comprise passive devices.

4. The method of claim 1, wherein the semiconductor die is an embedded semiconductor die comprising the conductive interconnect coupled to the semiconductor die and exposed with respect to the second mold compound.

5. The method of claim 1, wherein the conductive interconnect comprises copper bumps, pillars, posts, or thick RDL traces.

6. The method of claim 1, wherein the solder coupling the at least one of the singulated component assemblies to the substrate is contained within, and not exposed with respect to, the semiconductor component package.

7. A method of making a semiconductor component package comprising:

providing a substrate comprising conductive traces;

attaching a surface mount device (SMD) to the substrate with solder to form a component assembly;

mounting the component assembly to a temporary carrier with a first side of the component assembly oriented towards the temporary carrier;

mounting a semiconductor die comprising a conductive interconnect to the temporary carrier adjacent the component assembly;

encapsulating the component assembly and the semiconductor die with a mold compound while the component assembly and the semiconductor die are mounted to the temporary carrier to form a reconstituted panel; and exposing the conductive interconnect and the conductive traces at the first side or the second side of the component assembly with respect to the mold compound.

8. The method of claim 7, wherein the substrate comprises a two-layer laminate layer, a printed circuit board (PCB), or a blank mold compound panel.

9. The method of claim 7, further comprising encapsulating the SMD on the substrate with additional mold compound over and around the SMD before mounting the component assembly to the temporary carrier.

10. The method of claim 7, wherein the semiconductor die is an embedded semiconductor die comprising the conductive interconnect coupled to the semiconductor die and exposed with respect to the mold compound wherein the conductive interconnect comprises copper bumps, pillars, posts, or thick RDL traces.

11. The method of claim 7, wherein the solder coupling the component assembly to the substrate is contained within, and not exposed with respect to, the component assembly.

12. The method of claim 7, wherein exposing the conductive interconnect and the conductive traces further comprises removing the temporary carrier from the reconstituted panel and grinding the reconstituted panel.

13. The method of claim 7, further comprising:

forming a first redistribution layer over the reconstituted panel to electrically connect the conductive interconnect and the conductive traces; and forming a second redistribution layer opposite the first redistribution layer to electrically connect with the exposed conductive traces to form an electrical connection through a thickness of the semiconductor component package.

14. A method of making a semiconductor component package comprising:

providing a substrate comprising conductive traces;

attaching a surface mount device (SMD) to the substrate with solder;

mounting the SMD and substrate to a temporary carrier;

mounting a semiconductor die comprising a conductive interconnect adjacent the SMD;

dispensing mold compound over the temporary carrier; and exposing the conductive interconnect and the conductive traces with respect to the mold compound.

15. The method of claim 14, further comprising mounting the semiconductor die comprising the conductive interconnect adjacent the temporary carrier.

16. The method of claim 14, further comprising mounting the semiconductor die comprising the conductive interconnect adjacent the SMD.

17. The method of claim 14, further comprising dispensing mold compound to encapsulate the SMD and the semiconductor die thereby forming a reconstituted panel.

18. The method of claim 14, further comprising:

singulating the substrate to expose the conductive traces at a first side of the substrate; and mounting the SMD and substrate to the temporary carrier with the first side of the substrate and the exposed conductive traces oriented towards the temporary carrier.

19. The method of claim 14, wherein the substrate comprises a two-layer laminate layer, a printed circuit board (PCB), or a blank mold compound panel.

20. The method of claim 14, wherein the conductive interconnect comprises copper bumps, pillars, posts, or thick RDL traces.

* * * * *